United States Patent
Pan et al.

(10) Patent No.: US 7,060,592 B2
(45) Date of Patent: Jun. 13, 2006

(54) IMAGE SENSOR AND FABRICATING METHOD THEREOF

(75) Inventors: Jui-Hsiang Pan, Hsinchu (TW);
Cheng-Kuang Sun, Hsinchu (TW);
Kuang-Chih Cheng, Yunlin (TW);
Kuang-Shin Lee, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 31 days.

(21) Appl. No.: 10/711,377

(22) Filed: Sep. 15, 2004

(65) Prior Publication Data

US 2006/0057764 A1    Mar. 16, 2006

(51) Int. Cl.
*H01L 21/30* (2006.01)
*H01L 21/46* (2006.01)

(52) U.S. Cl. .......................... 438/458; 438/29; 438/60; 438/67; 438/70; 438/74; 438/75; 438/145; 438/457

(58) Field of Classification Search ................ 438/457, 438/458, 29, 70, 75, 60, 67, 74, 145, 144
See application file for complete search history.

(56) References Cited

U.S. PATENT DOCUMENTS

| | | | |
|---|---|---|---|
| 4,142,925 A * | 3/1979 | King et al. .................... 438/60 |
| 5,028,558 A * | 7/1991 | Haisma et al. ................. 438/3 |
| 5,536,361 A * | 7/1996 | Kondo et al. ................ 438/492 |
| 6,498,073 B1 * | 12/2002 | Sarma et al. ................ 438/459 |
| 6,607,968 B1 * | 8/2003 | Jurczak et al. .............. 438/455 |
| 2003/0087503 A1 * | 5/2003 | Sakaguchi et al. .......... 438/406 |
| 2004/0014240 A1 * | 1/2004 | Takeguchi et al. .......... 436/518 |
| 2004/0067621 A1 * | 4/2004 | Yanagita et al. ............. 438/455 |
| 2004/0262635 A1 * | 12/2004 | Lee ............................. 257/199 |
| 2005/0074954 A1 * | 4/2005 | Yamanaka ................... 438/458 |
| 2005/0110159 A1 * | 5/2005 | Oh et al. ..................... 257/777 |
| 2005/0205930 A1 * | 9/2005 | Williams, Jr. ............... 257/347 |
| 2006/0006488 A1 * | 1/2006 | Kanbe ......................... 257/443 |

* cited by examiner

*Primary Examiner*—Mary Wilczewski
*Assistant Examiner*—Seth Barnes
(74) *Attorney, Agent, or Firm*—Jianq Chyun IP Office

(57) ABSTRACT

An image sensor comprising an image sensing device layer, a silicon-on-insulator (SOI) layer, an optical device array and a substrate is provided. The SOI layer has a first surface and a second surface. The image sensing device layer is formed on the first surface of the SOI layer. The optical device array is formed on the second surface of the SOI layer. The substrate is disposed above the second surface of the SOI layer and the optical device array is disposed between the substrate and the SOI layer. An incident light coming from the outside environment, passes through the optical device array and the SOI layer, and is received by sensing devices formed in the image sensing device layer. In this manner, the probability of absorption or reflection of the incident light is reduced. Therefore, the sensing performance and the yield of the image sensor of the present invention is improved.

13 Claims, 4 Drawing Sheets

IMAGE SENSOR AND FABRICATING METHOD THEREOF

BACKGROUND OF THE INVENTION

1. Field of Invention

The present invention relates to an optical device and a fabricating method thereof. More specifically, the present invention relates to an image sensor and a fabricating method thereof.

2. Description of Related Art

With the popularization of multimedia, various digital image devices have been developed sequentially. An image sensor being a key component of digital image devices has gained significant importance. The function of an image sensor is to transform image information into electrical signals. Image sensors may be categorized into various types, such as charge coupled device image sensors (CCD image sensor), complementary metal oxide semiconductor image sensors (CMOS image sensor) etc. Due to low cost, low power consumption, random access ability and high integration ability, CMOS image sensors are widely used in popular products, such as camera phone and web-cameras.

FIG. 1 illustrates a schematic cross-sectional view of a conventional CMOS image sensor. Referring to FIG. 1, sensing devices 120 of a conventional CMOS image sensor 100 are formed in a substrate 102, wherein the sensing devices 120 comprise a plurality of photo diodes with p-n junctions formed in the substrate 102. More specifically, the sensing devices 120 formed in the substrate 102 comprise n-type doped regions, p-type doped regions and p-n junctions formed between the n-type doped regions and the p-type doped regions. An interconnection layer 104 comprising a plurality of metal interconnections and a plurality of inter-dielectric layers (not shown in figure) therebetween are formed on the substrate 102. An electrical signal representing image information received by the sensing devices 120 is transmitted to a printed circuit board (PCB) 110 via the metal interconnections, in order to process the received image information. A plurality of color filters 132 arranged in an area array are disposed on the interconnection layer 104, wherein each color filter 132 is aligned with one of the sensing devices 120, respectively. In addition, a plurality of micro-lenses 130 performing the function of condensing light, are disposed over the color filters 132. Furthermore, a glass substrate 134, disposed above the micro-lenses 130, is connected to the interconnection layer 104 by a spacer 150.

The light 140, which passes through the micro-lenses 130, the color filters 132 and the interconnection layer 104, is received by the sensing devices 120. Therefore, the layout of the metal interconnections (not shown in figure) should not overlap an area above the sensing devices 120 in order to improve the sensitivity of the sensing devices 120. However, this makes the layout design complicated.

Furthermore, the light 140 coming from the outside environment after passing through the interconnection layer 104 is degraded because it is partially shielded (absorbed or reflected) by the inter-dielectric layers of the interconnection layer 104, and thereby the sensitivity of the sensing devices 120 is affected significantly.

As described above, the sensing devices 120 receive the light 140 coming from the outside environment after it passes through the interconnection layer 104. Therefore, the conventional CMOS image sensor 100 has a low fill rate and contrast ratio (CR). Furthermore, the yield rate of the conventional CMOS image sensor 100 is also low.

SUMMARY OF THE INVENTION

The present invention provides a method of fabricating an image sensor, which has a high contrast ratio, which in turn, improves yield rate during the fabricating processes.

The invention provides an image sensor, which has a high contrast ratio and a small size (thickness).

As embodied and broadly described herein, the invention provides a method of fabricating an image device. First, a silicon-on-insulating layer is formed over a substrate, the silicon-on-insulating layer has a first surface and a second surface in contact with the substrate. An image sensing device layer is then formed over the first surface of the silicon-on-insulating layer. Next, a first substrate is disposed over the image sensing device layer. Sequentially, the first substrate, the image sensing device layer and the silicon-on-insulating layer are lifted from the substrate in order to expose the second surface of the silicon-on-insulating layer. Thereafter, an optical device array is formed over the second surface of the silicon-on-insulating layer.

In accordance with an embodiment of the present invention, a second substrate is disposed over the optical device array after forming the optical device array, wherein a material of the first substrate and the second substrate is, for example, glass or such other material. In accordance with another embodiment of the present invention, a spacer is formed over the second surface of the silicon-on-insulating layer before disposing the second substrate. Next, the second substrate is disposed over the spacer. This is done in order to ensure that the second substrate is held over the optical device array by the spacer.

In accordance with an embodiment of the present invention, the first substrate is removed so as to expose the image sensing device layer after forming the optical device array. In accordance with another embodiment of the present invention, the image sensing device layer is electrically connected to a printed circuit board after removing the first substrate. The image sensing device layer and the printed circuit board are electrically connected by forming a re-distribution layer over the image sensing device layer, and then electrically connecting the re-distribution layer to the printed circuit board. In accordance with yet another embodiment of the present invention, the re-distribution layer and the printed circuit board are electrically connected by performing a bumping process in order to form a plurality of bumps over the re-distribution layer, and then electrically connecting the bumps to the printed circuit board, wherein each bump is electrically connected to the re-distribution layer.

In accordance with an embodiment of the present invention, the optical device array over the second surface of the silicon-on-insulating layer is formed by forming a plurality of color filters over the second surface of the silicon-on-insulating layer, and then forming a condenser, such as micro-lenses, over each color filter.

In accordance with an embodiment of the present invention, the image sensing device layer is formed by performing the following steps: Firstly, an active layer is formed over the first surface of the silicon-on-insulating layer, wherein the active layer comprises a sensing device, such as a photo diode, therein. Next, an interconnection layer is formed over the active layer, wherein the interconnection layer is electrically connected to the sensing device. Thereafter, a plurality of bonding pads are formed over the interconnection layer, wherein each bonding pad is electrically connected to the interconnection layer.

In accordance with an embodiment of the present invention, a cutting process is performed to form a plurality of image sensor units after forming the optical device array.

As embodied and broadly described herein, the invention provides an image sensor. The image sensor includes a silicon-on-insulating layer having a first surface and a second surface, an image sensing device layer disposed over the first surface of the silicon-on-insulating layer, an optical device array disposed over the second surface of the silicon-on-insulating layer, and a substrate disposed over the second surface of the silicon-on-insulating layer, wherein the optical device array is located between the substrate and the silicon-on-insulating layer.

In accordance with an embodiment of the present invention, the image sensing device layer comprises an active layer disposed over the first surface of the silicon-on-insulating layer, an interconnection layer disposed over the active layer, and a plurality of bonding pads disposed over the interconnection layer, wherein each bonding pad is electrically connected to the interconnection layer.

In accordance with an embodiment of the present invention, the active layer of the image sensing device layer comprises at least one sensing device therein, wherein the sensing device comprises at least one photo diode having n-type doped regions, p-type doped regions and p-n junctions formed between the n-type doped regions and the p-type doped regions.

In accordance with an embodiment of the present invention, the optical device array comprises a plurality of color filters and a plurality of condensers, such as micro-lenses, wherein each condenser is disposed over one of the color filters, respectively.

In accordance with an embodiment of the present invention, the image sensor further comprises a spacer disposed between the second surface of the silicon-on-insulating layer and the substrate in order to hold the substrate above the optical device array.

In accordance with an embodiment of the present invention, the image sensor further comprises a re-distribution layer disposed over the first surface of the silicon-on-insulating layer, wherein the re-distribution layer is disposed on the image sensing device layer and is electrically connected to the bonding pads. In accordance with another embodiment of the present invention, the image sensor further comprises a plurality of bumps disposed over the re-distribution layer, wherein each bump is electrically connected to the re-distribution layer.

In the image sensor of the present invention, the sensing devices in the image sensing device layer directly receive the light passing through the SOI layer which has a small thickness. Next, an electrical signal, which represents image information received by the sensing devices, is output to a printed circuit board through bonding pads and bumps. Therefore, the degradation of the light resulting from absorption or reflection by the inter-dielectric layer and the metal layer of the interconnection layer does not occur, and thereby the sensitivity of the sensing devices is improved significantly. Furthermore, the complexity of the fabrication process is lowered as layout of conductive layers can be distributed over the entire area of the image sensing device layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide further understanding of the present invention, and are incorporated in and constitute a part of this specification. The drawings illustrate embodiments of the invention and, together with the description, serve to explain the principles of the invention.

DESCRIPTION OF THE EMBODIMENTS

The image sensor of the present invention, which has a short path over which incident light passes, is fabricated using a process, which enhances the optical performance of the image sensor. A CMOS image sensor is merely an example used for explaining the design and working of the present invention. Applications of the present invention are not limited to CMOS image sensors.

Figure 1:
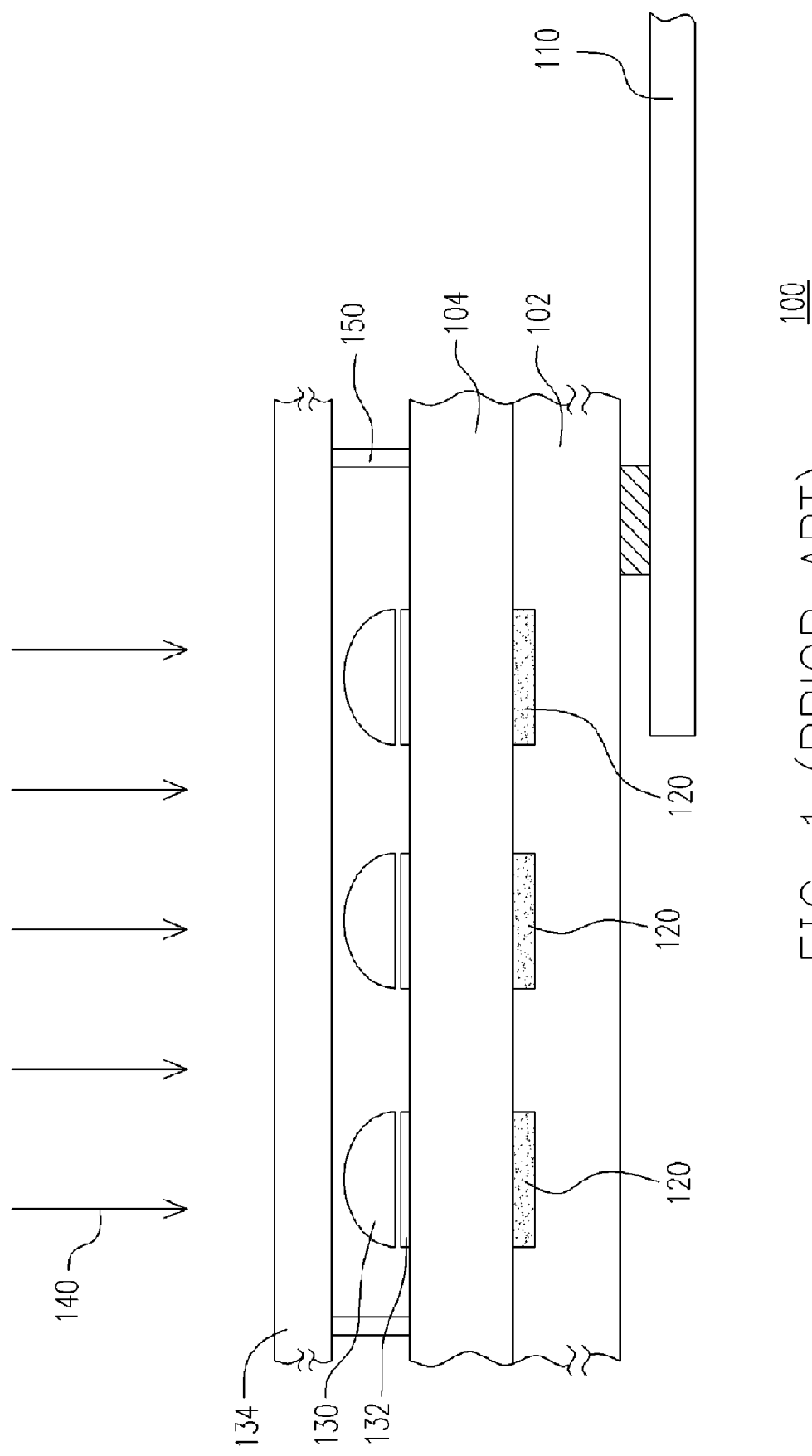
FIG. 1 illustrates a schematic cross-sectional view of a conventional CMOS image sensor.
Figure 2A:
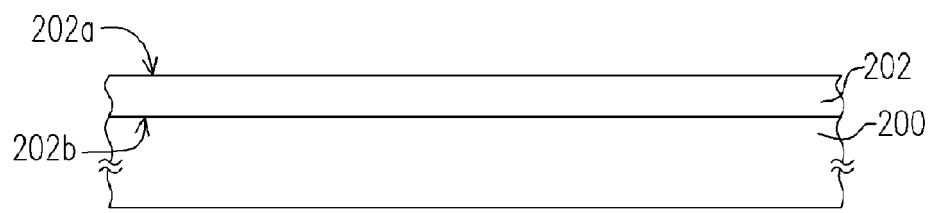
FIG. 2A to FIG. 2E are schematic illustrations of the fabricating process of a CMOS image sensor in accordance with an embodiment of the present invention.

FIG. 2A to FIG. 2E are schematic illustrations of the fabricating process of a CMOS image sensor in accordance with an embodiment of the present invention. Referring to FIG. 2A, first, a silicon on insulator layer (SOI layer) 202, which has a first surface 202a and a second surface 202b is formed over a substrate 200. The substrate 200 is, for example, a silicon wafer. In accordance with an embodiment of the present invention, the fabricating process of the SOI layer 202 is a conventional process, which is well known by persons skilled in the art. Therefore, details of the fabricating process are not included herein.

Figure 2B:
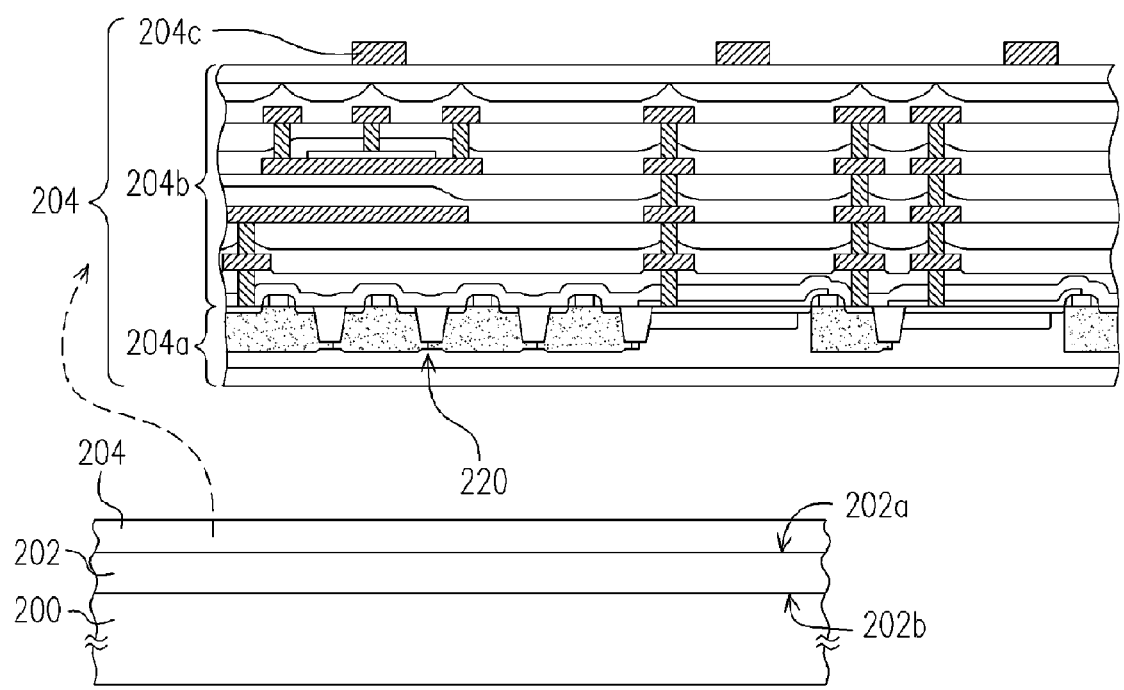

Referring to FIG. 2B, an image sensing device layer 204 is formed over the first surface 202a of the SOI layer 202. The image sensing device layer 204 comprises, an active layer 204a, an interconnection layer 204b and bonding pads 204c. The image sensing device layer 204 is illustrated in the upper portion of FIG. 2B. In accordance with an embodiment of the present invention, the interconnection layer 204b comprises a plurality of metal layers (shown by cross-hatching in the interconnection layer 204b in FIG. 2B), wherein the metal layers are electrically connected to the bonding pads 204c. Therefore, signal output from the active layer 204a is transmitted through the metal layers. More specifically, the sensing device 220 of the CMOS image sensor of the present invention comprises, photo diodes including n-type doped regions, p-type doped regions and p-n junctions formed in the active layer 204a.

Figure 2C:
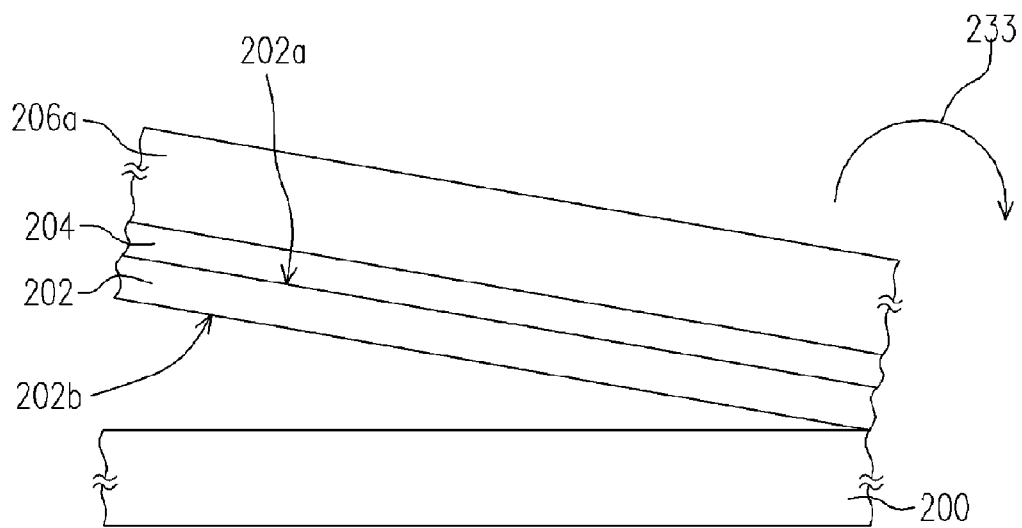
Figure 2D:
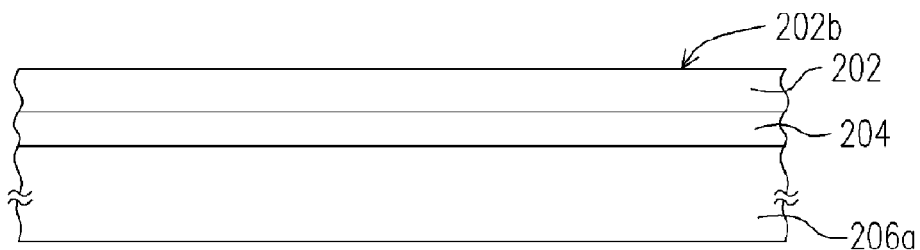

Referring to FIG. 2C and FIG. 2D, first, a first substrate 206a is disposed over the image sensing device layer 204. Next, the SOI layer 202, the image sensing device layer 204 and the first substrate 206a are lifted from the substrate 200, and are rotated 180 degrees along the direction of an arrow 233 in order to expose the second surface 202b of the SOI layer 202 (illustrated in FIG. 2D). In accordance with an embodiment of the present invention, a material of the first substrate 206a comprises, glass or other such materials.

Figure 2E:
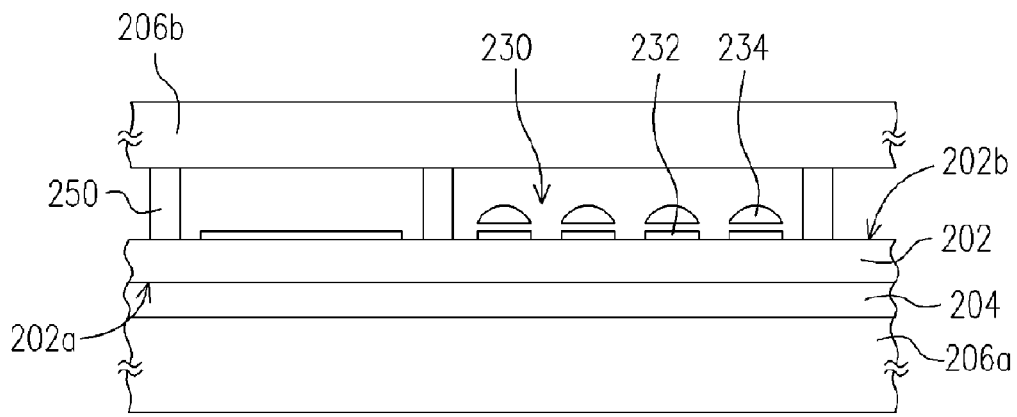

Referring to FIG. 2E, an optical device array 230 is formed over the second surface 202b of the SOI layer 202. Next, a second substrate 206b is disposed over the optical device array 230 to accomplish the fabricating process of the CMOS image sensor 260. In accordance with an embodiment of the present invention, a material of the second substrate 206b is, the same as the material of the first substrate 206a.

The optical device array 230 comprises a plurality of color filters 232 arranged in an area array and a plurality of condensers 234. Each color filter 232 is disposed over one of the sensing devices 220 formed in the active layer 204c, and each condenser 234 is disposed over one of the color filters 232, respectively. The condensers 234 focus the incident light coming from the outside environment on color filters 232. After passing through the color filters 232, the incident light is received by sensing devices 220 in the active layer 204c (illustrated in FIG. 2B), which is under the color filters 232. In accordance with an embodiment of the present invention, the color filters 232 comprise, a plurality of color filter films, which permit light of a certain wavelength to pass through. The condensers 234 comprise, a plurality of micro-lenses arranged in an area array. Furthermore, a spacer 250 is formed over the second surface 202b of the SOI layer 202 before disposing the second substrate 206b. The spacer 250 holds the second substrate 206b above the optical device array 230.

The image sensor of the present invention is formed by performing the process described above. It is well known in the art, that a cutting process can be performed to obtain a plurality of image sensor units, when the substrate 200 is a silicon wafer. The structure of an image sensor unit obtained after performing the cutting process is similar to the structure illustrated in FIG. 2E.

After the CMOS image sensor 260 illustrated in FIG. 2E is formed, it is disposed on a printed circuit board 210. The assembly process is described herein.

Figure 2F:
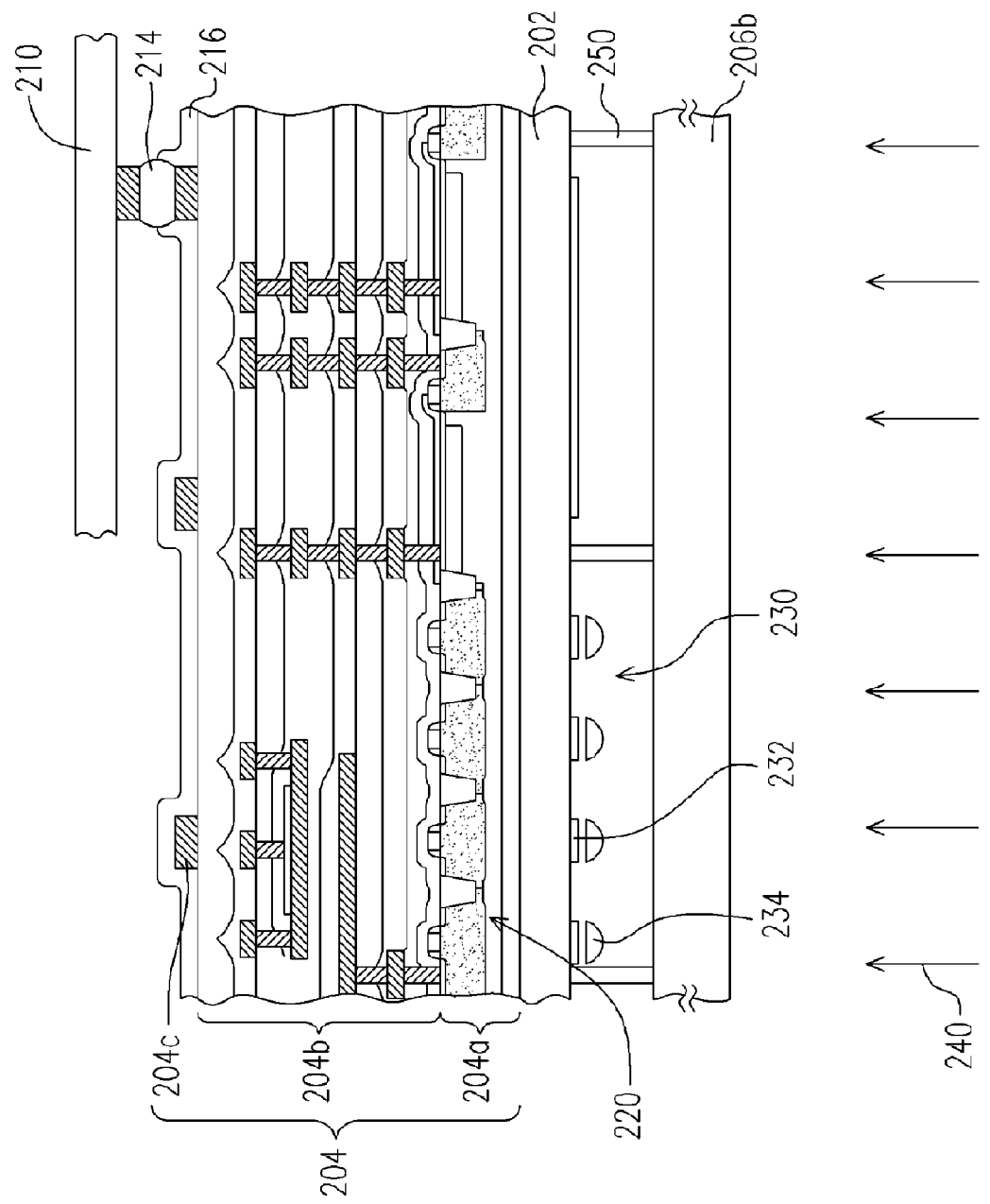
FIG. 2F is a schematic illustration of a printed circuit board (PCB) used for carrying the CMOS image sensor illustrated in FIG. 2E.

FIG. 2F is a schematic illustration of a printed circuit board (PCB) used for carrying the CMOS image sensor illustrated in FIG. 2E. Referring to FIG. 2F, a first substrate 206a is removed to expose the image sensing device layer 204. More specifically, after removing the first substrate 206a, the structure comprising the SOI layer 202, the image sensing device layer 204 and the second substrate 206b is rotated 180 degrees to form a plurality of bumps 214 by performing a bumping process. Next, the CMOS image sensor 260 is electrically connected to the printed circuit board 210 through the bumps 214 therebetween. Therefore, an electrical signal, which represents image information received by the sensing devices 220, is transmitted to a printed circuit board 210 through the metal layers, the bonding pads 204c and the bumps 214 in the interconnection layer 204b.

In accordance with another embodiment of the present invention, before forming the bumps 214, a re-distribution layer 216 is formed over the image sensing device layer 204 to re-distribute the position of the bumps 214, and thereby the position of the bonding pads 204c is optimized to prevent stress. The bumps 214 are formed over the nodes of the re-distribution layer 216 and are electrically connected to the bonding pads 204c through the conductive layers (not shown in figure) within the re-distribution layer 216.

As mentioned above, the optical performance of the image sensor, which is fabricated using the process described in the present invention, is enhanced because degradation of the incident light is reduced. The image sensor of the present invention, such as a CMOS image sensor, is described in detail with reference to the accompanying drawings.

Referring to FIG. 2F, the CMOS image sensor 260 comprises an image sensing device layer 204, a silicon-on-insulating layer 202, an optical device array 230 and a second substrate 206b. The silicon-on-insulating layer 202 has a first surface 202a and a second surface 202b. The image sensing device layer 204 is disposed over the first surface 202a of the silicon-on-insulating layer 202. The image sensing device layer 204 comprises an active layer 204a, an interconnection layer 204b and bonding pads 204c. The bonding pads 204c are electrically connected to the interconnection layer 204b. In accordance with an embodiment of the present invention the sensing device 220 of the CMOS image sensor 260 is a photo diode formed in the active layer 204a.

The optical device array 230 is disposed over the second surface 202b of the silicon-on-insulating layer 202. The optical device array 230 comprises a plurality of color filters arranged in an area array and a plurality of condensers. Each color filter 232 is disposed over one of the sensing devices 220 within the active layer 204a, and each condenser 234 is disposed over one of the color filters 232, respectively. The condensers 234 focus the incident light coming from the outside environment on color filters 232. After the incident light passes through the color filters 232, it is received by the sensing devices 220 present in the active layer 204c, which is under the color filters 232. Furthermore, a second substrate 206b is disposed over the optical device array 230 and is held above the optical device array 230 by the spacer 250. The spacer 250 is disposed over the second surface 202b of the SOI layer 202.

Furthermore, in accordance with one embodiment of the present invention the CMOS image sensor is electrically connected to the printed circuit board 210 through the re-distribution layer 216 disposed over the image sensing device layer and the bumps 214, as illustrated in FIG. 2F.

In accordance with one embodiment of the present invention, sensing devices in an image sensing device layer directly receive the light passing through a SOI layer, which has a small thickness. Next, an electrical signal, which represents image information received by the sensing devices, is output to a printed circuit board through bonding pads and bumps. Therefore, the degradation of the light resulting from absorption or reflection by an inter-dielectric layer and a metal layer of an interconnection layer occurring in a conventional image sensor, does not occur in the CMOS image sensor of the present invention. Thereby the sensitivity of the sensing devices of the CMOS image sensor of the present invention is improved significantly. Furthermore, the complexity of the process of fabricating the CMOS image sensor device is lowered as layout of conductive layers can be distributed over the entire area of the image sensing device layer.

In addition, since in accordance with the present invention, the substrate of the CMOS image sensor is fabricated using SOI technology, the total thickness of the CMOS image sensor is smaller than (about 1.6%) that of prior art CMOS image sensors. In the prior art CMOS image sensors, a substrate with a total thickness of 700 micrometers is usually utilized, whereas the CMOS image sensor of the present invention, utilizes a substrate with a total thickness of 11 micrometers. Also, the process for fabricating the CMOS image sensor of the present invention is compatible with the conventional process, and no investment for new equipment or establishment is required to be made.

The process used for fabricating the CMOS image sensor in accordance with the present invention also improves the yield of the CMOS image sensor.

It will be apparent to those skilled in the art that various modifications and variations can be made to the structure of the present invention without departing from the scope or spirit of the invention. In view of the foregoing, it is intended that the present invention cover modifications and variations of this invention, provided they fall within the scope of the following claims and their equivalents.

What is claimed is:

1. A method of fabricating an image device, comprising the steps of:
   forming a silicon-on-insulating layer over a substrate, the silicon-on-insulating layer having a first surface and a second surface in contact with the substrate;
   forming an image sensing device layer over the first surface of the silicon-on-insulating layer;
   disposing a first substrate over the image sensing device layer;
   lifting off the first substrate, the image sensing device layer and the silicon-on-insulating layer from the substrate so as to expose the second surface of the silicon-on-insulating layer; and
   forming an optical device array over the second surface of the silicon-on-insulating layer.

2. The method of claim 1, further comprising a step of disposing a second substrate over the optical device array.

3. The method of claim 1, further comprising a step of forming a spacer over the second surface of the silicon-on-insulating layer and a step of disposing a second substrate over the spacer after the step of forming the silicon-on-insulating layer over the substrate.

4. The method of claim 1, further comprising a step of removing the first substrate in order to expose the image sensing device layer after the step of forming the optical device array.

5. The method of claim 4, further comprising a step of electrically connecting the image sensing device layer to a printed circuit board after the step of removing the first substrate.

6. The method of claim 5, wherein the stop of electrically connecting the image sensing device layer to the printed circuit board comprises the steps of:
   forming a re-distribution layer over the image sensing device layer; and
   electrically connecting the re-distribution layer to the printed circuit board.

7. The method of claim 6, wherein the step of electrically connecting the re-distribution layer to the printed circuit board comprises the steps of:
   performing a bumping process to form a plurality of bumps over the re-distribution layer, wherein each bump is electrically connected to the re-distribution layer, respectively; and
   electrically connecting the bumps to the printed circuit board.

8. The method of claim 1, wherein a material of the first substrate and the second substrate comprises glass.

9. The method of claim 1, wherein the step of forming the optical device array over the second surface of the silicon-on-insulating layer comprises the steps of:
   forming a plurality of color filters over the second surface of the silicon-on-insulating layer; and
   forming a plurality of condenser, wherein each condenser is disposed over one of the color filters.

10. The method of claim 9, wherein the condensers comprise a plurality of micro-lenses.

11. The method of claim 1, wherein the step of forming the image sensing device layer comprises the steps of:
    forming an active layer over the first surface of the silicon-on-insulating layer, wherein the active layer comprises at least one sensing device therein;
    forming an interconnection layer over the active layer, wherein the interconnection layer is electrically connected to the sensing device; and
    forming a plurality of bonding pads over the interconnection layer, wherein each bonding pad is electrically connected to the interconnection layer.

12. The method of claim 11, wherein the sensing device comprises at least one photo diode.

13. The method of claim 1, further comprising a cutting process for forming a plurality of image sensor units after the step of forming the optical device array.

* * * * *